United States Patent [19]

Smith

[11] Patent Number: 4,796,357

[45] Date of Patent: Jan. 10, 1989

[54] METHOD AND APPARATUS FOR POSITIONING ELECTRICAL COMPONENTS

[75] Inventor: Ted M. Smith, Austin, Tex.

[73] Assignee: International Business Machines Corporation, Armonk, N.Y.

[21] Appl. No.: 155,773

[22] Filed: Feb. 16, 1988

[51] Int. Cl.⁴ ............................................. H05K 3/30
[52] U.S. Cl. ................................... 29/840; 29/402.08; 29/740; 29/743; 294/64.1
[58] Field of Search ............... 29/740, 741, 840, 759, 29/743, 402.08; 294/2, 64.1

[56] References Cited

U.S. PATENT DOCUMENTS 3,845,284 10/1974 Taguchi et al. .
3,985,238 10/1976 Nakura et al. .
4,132,318  1/1979 Wang et al. .
4,260,187  4/1981 Bejczy .
4,329,110  5/1982 Schmid .
4,624,050 11/1986 Hawkswell ........................... 29/740

Primary Examiner—Carl E. Hall
Attorney, Agent, or Firm—Robert M. Carwell

[57] ABSTRACT

A placement head assembly for use in an electrical component placement machine. A hollow main shaft has a carriage assembly disposed thereabouts with rollers providing axial movement along the shaft. A vacuum support shaft within the main shaft telescopes downwards to pickup and retain a component. The carriage assembly carries actuator means urging it into axial movement in response to fluid pressure differentials. Tweezer means are pendantly disposed in quadrature from pivot points about the shaft. Pivoting action of the tweezer means forces jaws radially inwards into contact with the component, thereby aligning it for subsequent board placement. In one embodiment, the actuator means includes a piston-cylinder assembly. Pressure differential across the piston causes downward movement of the carriage assembly. Reverse pressure differential urges the carriage assembly upward.

20 Claims, 6 Drawing Sheets

METHOD AND APPARATUS FOR POSITIONING ELECTRICAL COMPONENTS

TECHNICAL FIELD

This invention relates to electronic component placement machines, and, more particularly, relates to component placement head assemblies for usage in such machines.

BACKGROUND ART

Various forms of apparatus have been developed in the electronic manufacturing arts for automatically placing components on circuit boards. Such apparatus includes a placement machine having a releasably attached placement head assembly, a representative example of which may be seen depicted in accompanying FIGS. 1-3 which are simplified views of the assembly for placement machine model nos. MPS118, MPS500, MPS318, and MPS525 manufactured by the Dynapert Division of the Emhart Machinery Group, Beverly, Mass.

The function of such a head assembly is to automatically grasp a component from a supply thereof, align the component in proper orientation with respect to a site on the board, move it to the desired site and thence place it thereon for subsequent bonding by means by wave or vapor soldering or the like.

With more particular reference to the construction and operation of such a head assembly, in FIG. 1 a placement head 10 is illustrated therein as well as an actuator 12 which, although not an integral part of the head assembly 10, is included as part of the component placement apparatus and co-acts with the assembly to achieve the aforementioned function. The actuator 12 provides motive force in the direction of arrows 14 and 16 which is transferred by actuating lever 18 (pivoted about pivot point 20) to the head assembly 10. More particularly, movement of the actuator 12 in the direction of arrows 14 and 16 produces corresponding opposed motion in the direction of arrows 24 and 22, respectively, by pivoting action of the lever 18 about pivot point 20. The lever 18 includes a bearing 26 which engages an upper surface 28 of a flange 30 portion of an inner tweezer actuating sleeve 32. This sleeve 32 is disposed about a circular main shaft 34 which is, in turn, connected to the placement apparatus.

A similar actuator-lever mechanism is provided (omitted for clarity) having a similar bearing contacting the upper surface 33 of the flange 36 portion of an outer tweezer actuating sleeve 38. The main shaft 34, inner and outer sleeves 32 and 38, respectively, are in coaxial sliding engagement with one another.

Four tweezer arms 40 are pendantly disposed in quadrature about the shaft 34 although in FIG. 1 only three such tweezer arms 40 are visible. The tweezer arms 40 are pivotably connected to the shaft 34 by means of pivot points 42. With reference to the leftmost tweezer arm 40 as an example, such pivoting about point 42 results in the upper and lower portions of the arm 40 moving in opposing directions of the arrows 44 and 46 respectively about the pivot point 42 or conversely in the direction of arrows 48 and 50 respectively.

Each sleeve 32 and 38 is provided with a pair of diametrically opposed bearings. Thus, with further reference to FIG. 1 and the inner sleeve 32, these tweezer actuating rollers 52 may be seen in contact with corresponding upper roller surfaces of respective tweezer arms 40. In like manner to the tweezer arms 40 only three such rollers 52 may be seen.

Upon downward urging of inner sleeve 32 by means of previously described movement of the actuator 12 and lever 18, the rollers 52 will roll on surfaces 54 of the tweezer arms 40 as they move downwards urging the upper portions of the tweezer arms 40 in a radially outward direction of arrow 44. This in turn causes movement radially inwards in a direction of arrows 46 by the tweezer arms 40 to orient a component disposed centrally thereof. Similar downward movement of the outer sleeve 38, also causing rolling engagement of roller 52 with correlative surfaces of the upper portions of tweezer arms 40 also causes such radially inward movement of the remaining pair of tweezer arms. A spring 56 is disposed circumferentially about and in engagement with the upper portions of the four tweezer arms 40 biasing these upper tweezer arm portions radially inwards. In this manner after the aforesaid radially inward movement of the lower portions of tweezer arms 40 causes by the downward movement of the sleeves 32 and 38, the spring 56 will cause a restoring force radially inwards on the upper portions of the tweezer arms 40 to restore the arms 40 to the positions shown in FIG. 1 prior to a next downward urging of the sleeves 32 and 38.

With reference to FIG. 2, the head assembly 10 is typically provided with a plurality of tweezer heads 60, each comprised of a jaw adjusting block 62 and tweezer jaw 64 disposed on a respective lower end of its corresponding tweezer arms. The block 62 is attached to the lower end of each respective arm 40 by means of a screw 66 through a slot 68 in the block 62. The tweezer jaw 64 is retained in the jaw block 62 by means of a screw 68 extending through screw hole 70. An inner gripping surface 72 is thereby presented radially inward for aligning contact with the component.

The general sequence of operation of such a previously known placement head assembly 10 may be seen with reference to FIGS. 3A-3G. With reference to FIG. 3, an additional component of the assembly 10 not hereinbefore discussed may be noted, namely a vacuum support means 74 interconnected in coaxial sliding engagement within the hollow main shaft 34 and movable in the direction of the longitudinal axis of such shaft 34 and vacuum support means 74. A plurality of components 76 to be placed on circuit board sites are conventionally provided carried by a roll of tape. In the operation depicted in FIG. 3, the vacuum support means 74 is lowered so as to contact the upper surface of one of the components 76 whereupon a vacuum is drawn through the vacuum support 74 so that the component may be temporarily suspended from the end of the vacuum support 74 as shown in FIG. 4.

Upon the downward movement of the sleeves 32 and 38 as a result of the motion provided by the actuators 12, the tweezer arms 40 are caused to move radially inwards in a manner previously described whereby the respective inner component contacting surfaces 72 of each tweezer head 60 contacts a respective side of the component 76 in quadrature so as to align the component as desired in a plane normal to the longitudinal axis of the head assembly 10 for subsequent placement on the circuit board site. Such inward movement of the tweezer heads 60 may be seen by a comparison of their position in FIG. 4 with that of their subsequent position in FIG. 5. Inasmuch as the component is only marginally supported at this point by means of the vacuum support 74, the component is free to move about on the end thereof whereby contact with the jaws 64 will cause the component to be oriented as defined by the inward contact of the jaws 64 with the component sides.

Comparison of FIGS. 5 and 6 will indicate that the head assembly 10 may thence be rotated in any manner desired and moved laterally by various mechanical linkages, robotics arms or the like so as to position the component 76 as shown in FIG. 7, with the component vertically adjacent a desired site 78 on a circuit board 80. This site 78 may include deposition of epoxy dots as desired so as to cause the subsequently placed component to adhere thereto. It may further be seen from FIG. 7 that as a result of return movement of the actuators 12 in the direction of arrow 16 and the inward biasing action of the spring 56 on the upper portion of the tweezer arms 40, the tweezer heads 60 are thence moved radially outwards away from the vacuum support 74 and component 76. In FIG. 8, the vacuum support 74 has been urged downwards so as to cause the component 76 to contact the site 78 on the board 80. Finally, in FIG. 9 the vacuum has been terminated in the vacuum support 74 hwich has thence been urged upwards leaving the component 76 deposited on the site 78 as desired.

With the foregoing description completed of general operation of the placement head assembly 10, several serious deficiencies in the design thereof may now be noted which have been eliminated by the instant invention.

First, due to the coaxial sliding engagement between the main shaft 34, inner and outer sleeves 32 and 38, several problems have quite frequently arisen. Because of the leverage effect of the tweezer arms 40 lateral displacement of the sleeves 32 or 38, due to play between the various moving components (particularly the sleeves) may result in imprecise and inconsistent movement of the jaws 64 and their contacting surfaces 72 and their final radially inwardmost positions. In that this final position dictates the precise final alignment of the component 76 for subsequent placement on the circuit board 80, such play results in inaccurate placement of the component on the circuit board site. With increasing chip densities and smaller components, the problem is exacerbated due to need for increasingly more precise component placement. Lateral positioning inaccuracies of the sleeves 32 and 38 may be multiplied by as much as a factor of 12 in the position of the inner jaw contacting surfaces 72 by reason of the aforementioned leverage effect of the tweezer arms 40.

Improving closeness of the fit between the sleeves 32, 38 and shaft 34 may control the problem but have associated higher manufacturing cost associated therewith as well as maintenance problems in maintaining the sliding surfaces in a smooth, polished or oiled state.

Increased friction or variation in friction caused by closer tolerances creates an additional problem in controlling the amount of aligning force imparted to the components 76 by the jaws 64. The jaws 64 typically engage connector leads on the outer periphery of the components 76 during the aligning process. Circuit density increases result in smaller components with attendantly smaller and more fragile circuit leads and housings which in turn call for previse control over the forces applied inwardly to the component. Such control is rendered difficult by the sliding mechanism of the sleeves 32 and 38. Undesired deformation of the components 76 is often caused by yet an additional and related design deficiency of prior head assemblies. In order to maintain smooth sliding surfaces the sleeves 32 and 38 are typically machined of a dense metal such as brass or the like resulting in collars or sleeves with relatively large inertias imparted through the tweezer arms 40 to the components 76. This results in undesirable excessive impacts of the jaw heads on the components leading to destruction of the components, crushing of the leads thereof, and the like. Moreover, the upward restoring force to these heavy sleeves 32 and 38 must be completely provided by the retention spring 56 thereby giving rise to additional problems.

Yet an additional and even more serious problem related to prior head assemblies 10 results from the fact that the actuators 12 are integral parts of the placement machine itself and separate from the head assembly 10. Consequently, mechanical linkage between the actuators 12, actuating levers 18 and head assembly 10 is only completed for final calibration and adjustment when the head assembly 10 is on the machine. Accordingly, expensive down times were associated with replacement of head assemblies inasmuch as such alignment and adjustment of the head assembly had to occur in situ when in place in the machine thereby reducing the productive time of such expensive placement machines, typically costing hundreds of thousands of dollars. Due to the relatively complex linkages associated with the placement machine and head assemblies, no means was readily available for off-line adjustment and alignment of the head assembly so as to minimize down time of the placement machine during head assembly replacement.

For the foregoing and other reasons, a placement head assembly was desired which was simpler, more reliable, less expensive and non-destructive of the component sought to be placed, and which could significantly reduce placement machine down time during head assembly replacement while providing for off-line adjustment and alignment thereof.

DISCLOSURE OF THE INVENTION

A placement head assembly for use in an electrical component placement machine is disclosed. The assembly includes a hollow main shaft and a carriage assembly disposed thereabouts which, by means of antifriction means carried by the carriage assembly in rolling contact with the shaft's outer surface, is movable axially along the shaft. A vacuum support shaft in coaxial alignment within the main shaft telescopes downwards to pickup and retain a component by suction for subsequent alignment in a plane substantially normal to the longitudinal shaft axis.

The carriage assembly carries actuator means urging the carriage assembly into axial movement relative to the shaft in response to a pressure differential applied thereto. Tweezer means are pendantly disposed in quadrature from pivot points about the shaft, whereby jaws at the lower ends of the tweezer means are thereby positioned circumferentially about the component when suspended from the vacuum support.

Downward movement of the carriage assembly causes lower bearing surfaces thereon to engage corresponding surfaces of upper ends of the tweezer means, thereby forcing these upper ends radially outwards. Pivoting action of the tweezer means correspondingly forces the jaws radially inwards from four quadrants into contact with the component, thereby aligning it in a plane substantially normal to the longitudinal axis of the shaft for subsequent placement on the circuit board. A spring circumscribes the shaft engaging the outer edges of the upper ends of the tweezer means for returning the tweezer upper ends to their radially inward positions.

In one embodiment, the actuator means includes a piston-cylinder assembly. Pressure differential in one direction across the piston head causes downward movement of the carriage assembly. Reverse pressure differential urges the carriage assembly upward, thereby relieving the tweezer means of weight of the carriage assembly. Spring-loaded return of the jaws to the radially outwards position prior to contact with the component is thereby facilitated. By providing antifriction means on the carriage assembly in rolling contact with the shaft outer surface, the carriage assembly may be tightened about the shaft as desired to minimize lateral play which contributes to inaccuracy and nonuniformity of jaw movement, in part due to the leverage affect of the tweezer means, while at the same time reducing friction. In one embodiment this antifriction means takes the form of rollers spaced about the shaft in rolling contact with the shaft outer surface, these rollers preferably each having a ball bearing disposed therein. Rapid and reliable off-line adjustment and calibration of the placement head is also facilitated by this provision of roller engagement with the shaft as well as by provision of the pressure-activated actuator means being carried by the carriage assembly itself. This, in turn, reduces placement machine down time when placement head assemblies are replaced, whereby pre-adjusted and pre-aligned head assemblies may be installed in accordance with the present invention minimizing the adjustment and alignment time of such assemblies while on the machine.

BRIEF DESCRIPTION OF THE DRAWINGS

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

BEST MODE FOR CARRYING OUT THE INVENTION

Figure 10:
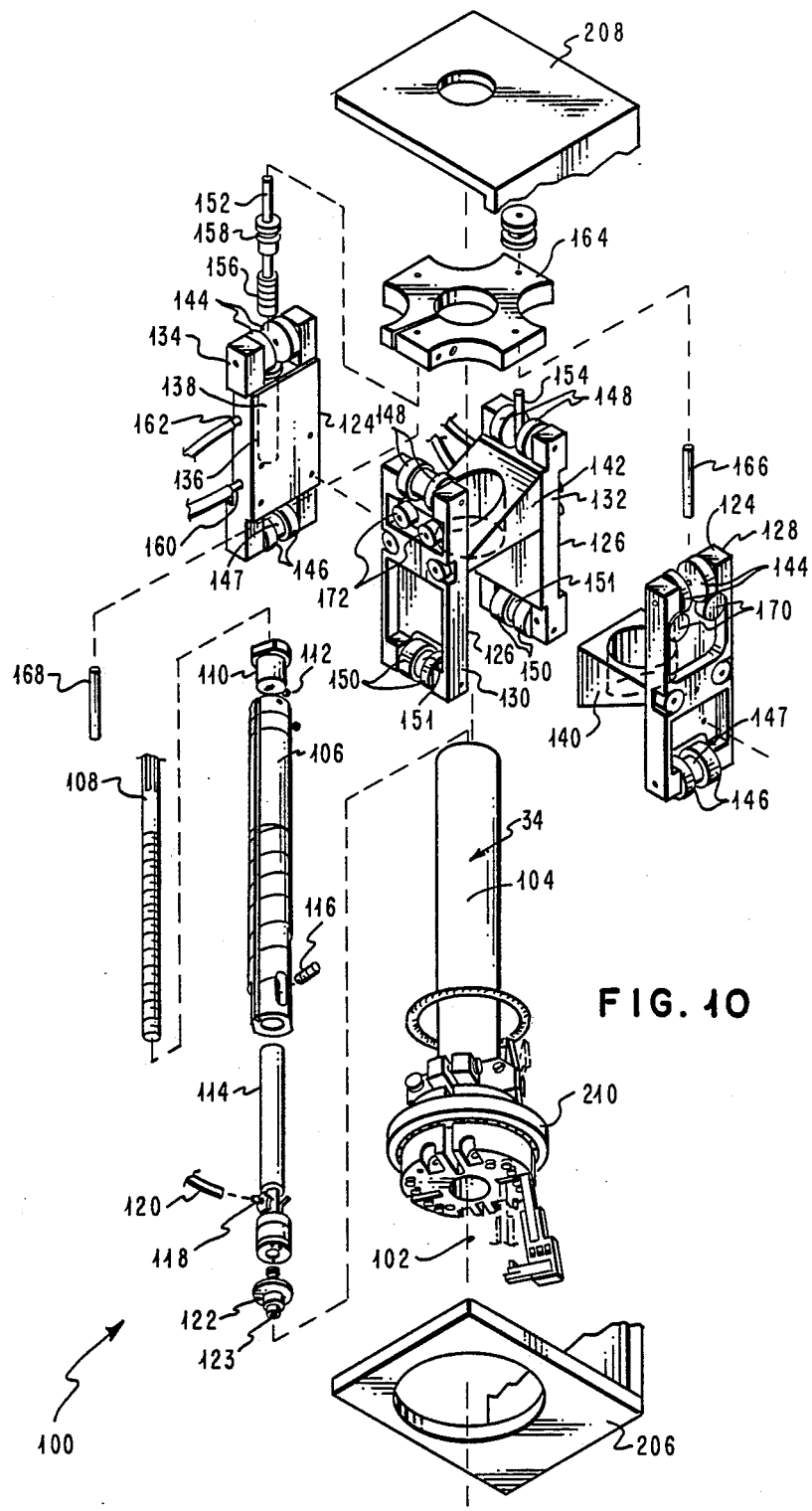
FIG. 10 is a partially exploded pictorial view of the placement head assembly of the present invention.

Referring now to FIG. 10, a placement head assembly 100 of the present invention may be seen depicted therein in exploded view. A hollow main shaft 34 defines a cylindrical outer surface 104 and is coaxially aligned along longitudinal axis 102. It will be recalled that a vacuum support means is provided for supporting a chip for alignment in a plane normal to the axis 102 by the head assembly 100 prior to placement on a circuit board. Accordingly, the vacuum support means will include in coaxial alignment with main shaft 34 an inner shaft 106, threaded lead screw 108 and tool holder 114. The lead screw 108 extends downwards from above the rest of assembly 100 and is interconnected to the placement machine. Additionally, threads thereon are threadedly received by a lead screw nut 110 which in turn is received by the upper end of inner shaft 106 and retainedly held therein by grub screw 112. The lower end of shaft 106 receives the tool holder 114 (which is retainedly but slidably held therein by means of guide pin 116) extending through a slot in shaft 106 and into a threaded hole in holder 114. Sliding coaxial engagement between the shaft 106 and tool holder 114 by co-action of the slot and pin 116 permits vertical compliance of the tool holder 114 as required for proper component placement.

Figure 3:
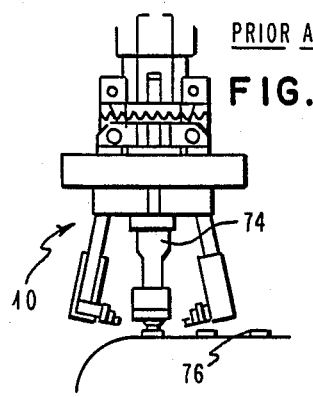
FIGS. 3-9 are side pictorial views of the head assembly of the prior art depicted in FIG. 1 illustrating the sequential operation thereof in placing a component on a circuit board.
Figure 4:
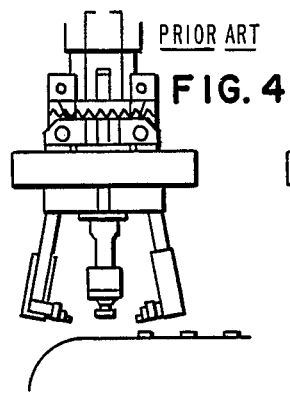
Figure 5:
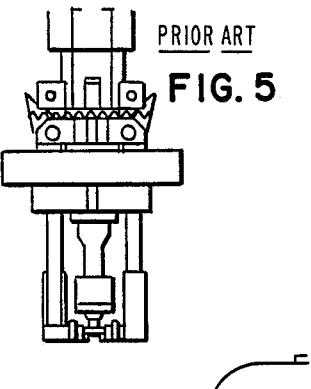
Figure 6:
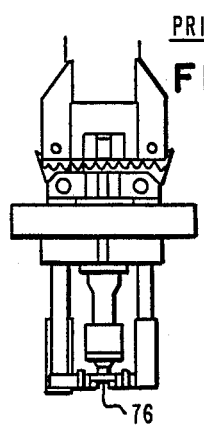
Figure 7:
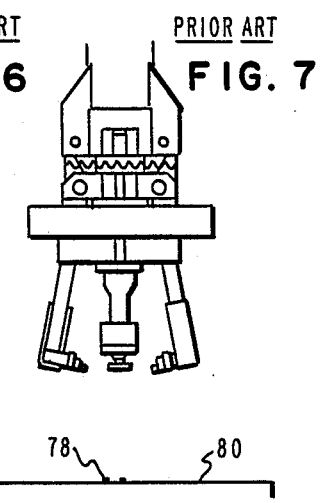
Figure 8:
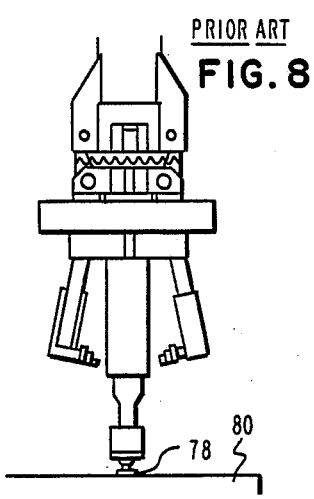
Figure 9:
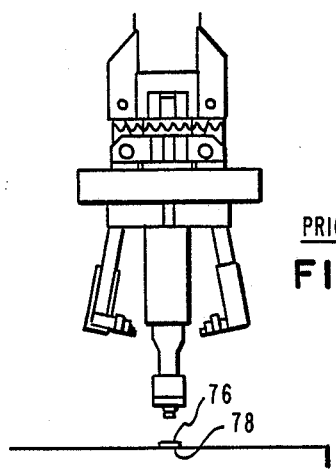
Figure 17:
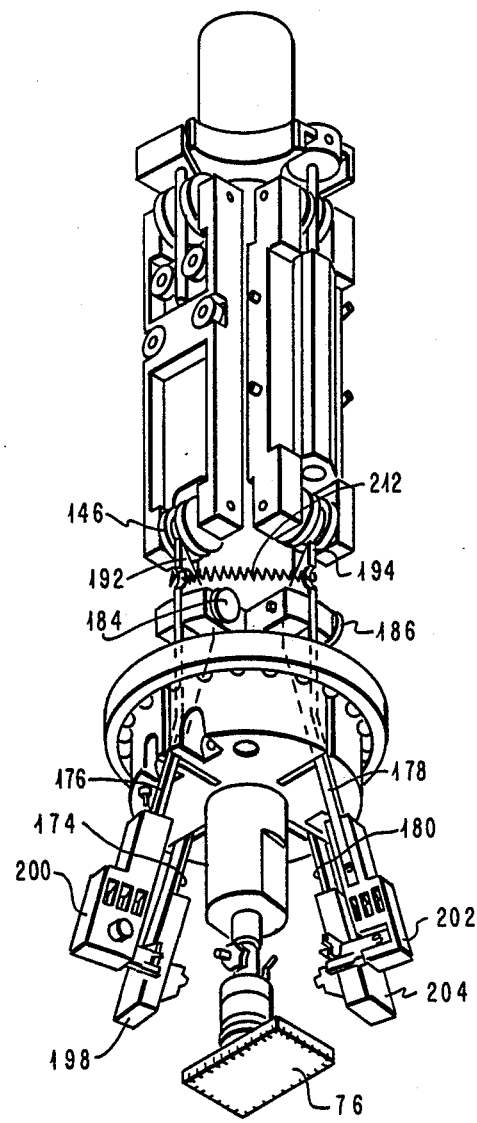
FIG. 17 is another pictorial view of the placement head assembly depicted in FIG. 11 rotated 180 degrees with the vacuum support distended axially downwards supporting a component with the aligning tweezer arm jaws radially outwards.

On the lower end of tool holder 114 is a nozzle piece 122 having an orifice 123 in fluid communication internally of the nozzle piece 122 and tool holder 114 with a vacuum hose barb 118 to which is connected a vacuum hose 120 and gated supply of vacuum fluid pressure. In assembly, the vacuum support means will act in a manner depicted in FIGS. 3-9 and FIG. 17. Upon the support means being lowered by sliding engagement within the shaft 34, the orifice 123 is caused to contact the upper surface of the component to be placed whereupon vacuum drawn on the hose 120 and conveyed to the orifice 123 causes the chip to adhere to the support means, whereupon it may be raised and supported as shown in FIG. 3, 4 and FIG. 17 for subsequent alignment and placement on the circuit board 80 as previous described.

Alignment means is provided for aligning the thus-supported chip 76 in a plane substantially normal to the longitudinal axis 102. In one embodiment, such alignment means takes the form of a carriage assembly disposed about the shaft 34. The carriage assembly preferably include two pairs of carriages 124, 126. For purposes of convenience, only one such pair will be described in detail. However, reference numerals in parenthesis immediately following those referring to this described pair will refer to correlative structure and features of the remaining carriage pair 126. Accordingly with respect to carriage pair 124, it will in turn be comprised of a passive car 128 (130) and an active car 134 (132). Disposed within the active car is a cylinder wall 136 defining a piston chamber 138 (not shown in active car 132). It is a feature of the invention to provide for reduction in the number of different parts required for the carriage assembly, and accordingly the passive cars and components thereof are substantially identical as is also the case with respect to the active cars. Accordingly only features with respect to one of the car-pairs may be depicted in detail in FIG. 10.

Figure 11:
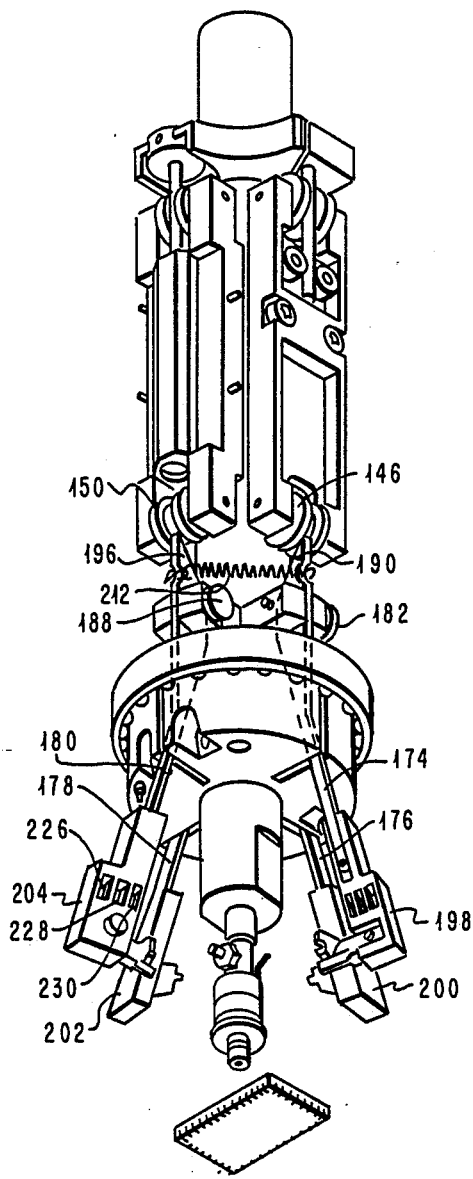
FIG. 11 is another pictorial view of the placement head assembly of the present invention.
Figure 16:
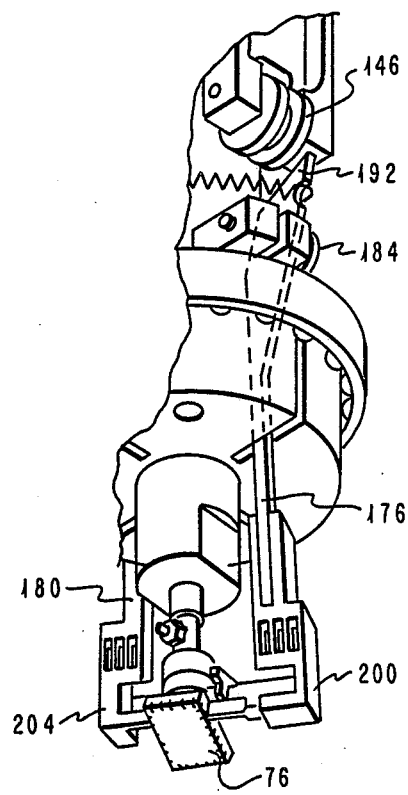
FIG. 16 is another pictorial view of a portion of the placement head assembly of FIG. 11 with two tweezers jaws in contact with a component.

Still referring to FIG. 10, a bracket-like support member 140 (142) interconnects passive-active cars 128–134 (130–132) of pair 124 (126) by means of four rectangularly placed screws or the like. Upper rollers 144 (148) and lower rollers 146 (150) on the carriage pair 124 (126) are provided. Thus, when the carriage pairs are in assembly by means of interconnection by the support members, as shown in FIG. 11, the entire carriage assembly will easily move coaxially about the main shaft 34 by reason of the rollers 144–146 (148–150) being in rolling engagement with the outer surface 104 of the main shaft 34. It will be noted that carriages 124 and 126 may move vertically independent of one another.

Each roller such as 144, 146, 148 or 150 preferably is actually a pair of rollers, each having disposed therein in coaxial alignment a corresponding ball-type bearing. These ball bearings are mounted on a shaft. In this manner, little friction is encountered during the rolling movement of the carriage along the shaft due to the rolling contact of these rollers in combination with the friction-reducing ball-type bearings upon which each roller is riding.

With respect to lower roller pairs 146 and 150, yet an additional ball-type bearing 147 and 151, respectively, is disposed between each roller of a given pair, and is mounted on the same shaft as the rollers of the pair.

It is a feature of the present invention to provide a rolling-type engagement between the carriage assembly and the shaft and antifriction means for doing so. In the embodiment depicted herein, this antifriction means takes the form of rollers having surfaces in rolling contact with the shaft which ride on friction-reducing ball-type bearings. Thus, both the rollers and the ball-type bearings contribute to the friction reduction. However, the invention is not intended to be so limited and admits of other variations in terms of numbers of rollers provided and their disposition about the shaft, rollers without ball-type bearings, ball-type bearings having outer surfaces in direct contact with the shaft (as opposed to being disposed within the roller), and the like.

Associated with each active car is a piston head support shaft 152 (154) having disposed thereon piston heads 156 and 158 (not shown for car 132). These piston heads extend into the piston chamber 138 and are in sealingly and sliding engagement with the cylinder walls 136 defining such chamber. With respect to each active car, a pair of ports 160, 162 (not shown with respect to active car 132) are provided, one each on either side of one of the piston heads (see FIG. 18). These ports provide fluid communication between the chamber 138 and a source of selectively variable fluid pressure differential outwards of the carriage assembly which is delivered to the ports 160 and 162 by any convenient means such as pressurized hoses or the like.

A cross-shaped shaft support 164 connects to the main shaft 34 and has pendantly disposed downwards therefrom, in addition to piston head support shafts 152 (154), passive car guide shafts 166 (168). A pair of roller bearings 170 (172) mounted on passive cars 128 (130) engage respective guide shafts 166 (168) to maintain vertical alignment of the carriage assembly about axis 102 and thus to prevent wear on the piston heads.

FIGS. 11 and 17 depict the head assembly 100 in a first view and a second view rotated 180 degrees about the axis 102, respectively. Referring to such figures now in detail, four tweezer arms 174, 176, 178 and 180 are provided disposed in quadrature about the main shaft 34 and are supported by respective pins 182, 184, 186 and 188 disposed therethrough and supported by the shaft 34. In this manner as upper ends 190, 192, 194 and 196 of the tweezers 174–180 are urged radially outwards by engagement with outer surfaces of respective ball-type bearings 147 and 151, pivoting action about these pins 182–188 causes lower ends of the tweezers 174–180 (which carry respective tweezer heads 198, 200, 202 and 204) to move radially inwards toward axis 102. Conversely, radially inward movement of the upper ends 190–196 of the tweezers causes correlative radially outward movement of the tweezer lower ends and head 198–204. A retention spring 212 circumscribes upper ends 190–196 of tweezers 174–180 s as to bias these upper ends radially inward as shown in FIG. 11 so that the tweezer head 190–204 are in a normally radially outward or open position.

With respect to FIG. 10, head assembly supports 206 and 208 are provided as part of the placement machine to support the head assembly 100 when installed thereon. A bottom bearing 210 of the head assembly 100 coacts with support 206 to permit head assembly 100 to rotate about its axis for proper rotational orientation of the component 76 as desired.

Figure 12:
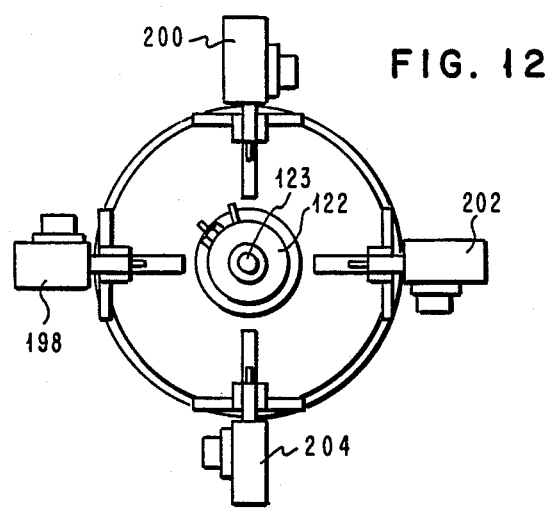
FIGS. 12-15 are bottom views of the placement head assembly of FIG. 11 depicting a sequence of operation thereof in aligning a component in a plane normal to the longitudinal axis of the head assembly.
Figure 13:
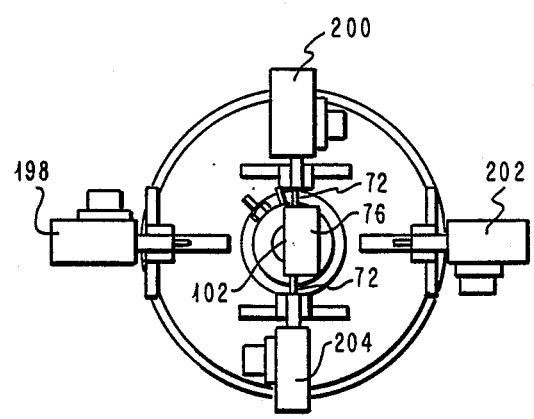

A representative type of operation of the alignment means in adjusting position of the chip 76 in a plane normal to axis 102 for precise placement on the circuit board may best be seen with reference to the sequence of FIGS. 12–15 which are bottom views of the head assembly 100 in various stages of operation. In FIG. 12, the carriage assembly is at the vertically upward position in its stroke by reason of proper charging of the ports 160, 162 of the active cars 134 (132) in a matter described with reference to FIG. 18 and/or the upper biasing thereof provided by the retention spring 212. In FIG. 13, the vacuum support means has been urged downwards by the lead screw 108 and a vacuum drawn through hose 120 and orifice 123 is thereby supporting the chip 76. Moreover, tweezer heads 200 and 204 have been urged radially inwards by proper charging of the ports of the active carriage associated therewith whereupon the contact points 72 of the respective tweezer heads 200 and 204 are brought into contact with the sides of the chip 76. It will be noted in FIG. 13 that for illustrative purposes the chip has been undesirably displaced and uncentered to the right off-axis from the longitudinal axis 102.

Figure 14:
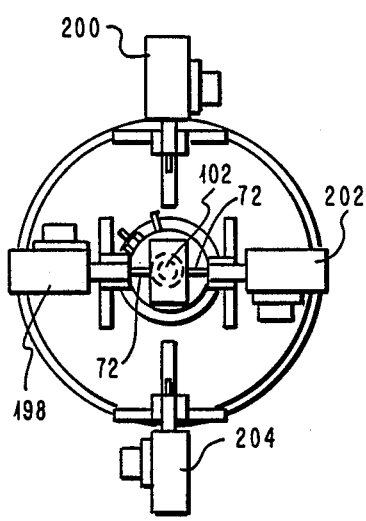

In FIG. 14, relaxing or reversal of the pressure differential in the ports of the active carriage associated with the tweezer head pair 200–204 coupled with the effect of the retention spring 212 has resulted in the tweezer heads 200 and 204 moving radially outwards from the chip 76. However, proper charging of the ports associated with tweezer heads 198 and 202 has now caused their respective contact points 72 to move radially inwards contacting a second pair of opposing sides of the chip 76. Comparison of FIGS. 13 and 14 will indicate that as a result of such contact, the chip 76 has moved leftward in the plane normal to the axis 102 so as to now be centrally aligned therewith as desired for subsequent placement of the chip on the circuit board.

Figure 15:
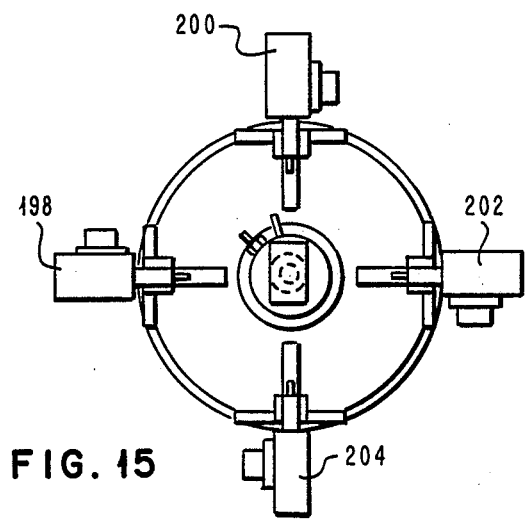

In FIG. 15 as in like manner to FIG. 13, the relaxation or reversal of pressure differential in the ports associated with tweezer heads 198 and 202 in conjunction with operation of the retention spring 212 causes these tweezer heads to move radially outwards away from the chip which has now been positioned as desired rotationally in a plane with respect to the axis in preparation for subsequent placement on the circuit board. It will be recalled from previous discussion regarding FIGS. 3-9 that as shown in FIGS. 3-9 reverse steps thence occur with respect to the vacuum support means from those in which the component was first lifted vertically upwards from a supply tape of such components in preparation for alignment by the alignment means, namely, that the vacuum support means is now urged downwards bringing the chip into contact with the site 78 upon which it is to be placed. Upon release of vacuum drawn on the hose 120, the chip 76 is no longer supported by the nozzle piece 122 and the vacuum support means may then be urged axially upwards in preparation for placement of the next component.

In that each active-passive car pair can be moved independently with respect to the other pair (dependent upon when the pressure differentials across the ports 160-162 of each port pair are established relatively), it is a matter of choice as to whether all four jaws 198-204 are moved radially inwards simultaneously or whether jaw pairs 200-204 and 198-202 are moved into contact with chip 76 sequentially. With respect to components with no leads, simultaneous movement and contact is typical. However, with components having leads, typically to avoid lead bending, one jaw pair is first urged into such contact and released followed by radially inward movement and aligning contact by the remaining jaws with and release from the leads on the opposing component sides.

Figure 18:
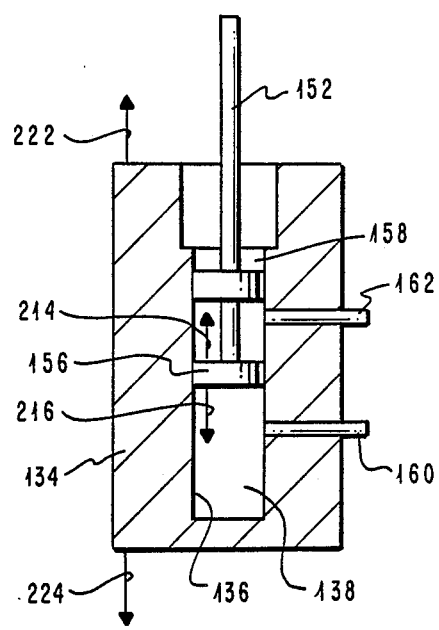
FIG. 18 is a simplified cross section of one of the active carriages.

FIG. 18 is a simplified cross section of one of the active carriages depicting how a pressure differential introduced across the piston head 156 within the chamber 138 defined by cylinder wall 136 through the ports 160 and 162 will cause desired movement in the direction of arrow 224 to urge the tweezer heads inwards or, alternatively, in the direction of arrow 222 to move readily facilitate movement of the tweezer heads radially outwards after component alignment on the vacuum support assembly. Upon introducing a positive pressure at port 160 relative to port 162 across the piston head 156, the active carriage 134 will accordingly be urged in the direction of arrow 224 relative to the shaft 152 which is fixedly attached to the main shaft 34. Conversely, upon introduction of a positive pressure at port 162 relative to that of port 160 a positive pressure within the portion of the chamber 138 between piston heads 156 and 158 relative to the remaining portion of the chamber 138 below piston head 156 will urge the carriage 134 upwards in the direction of arrow 222 thereby eases the function of the retainer spring 212 in moving the upper portions of the tweezer arms radially inwards and correlatively moving the tweezer jaws radially outwards away from the chip 76.

With reference now to the particular design of the tweezer heads 198-204 of the present invention, as shown in FIG. 11, it will be noted that each such head is provided with a plurality of apertures 226, 228, and 230 wherein material is removed from the jaw adjusting block, such apertures extending transversely or perpendicularly to the radially inward and outward directions of travel of the tweezer heads. The purpose of such design and material removal is two fold.

Figure 1:
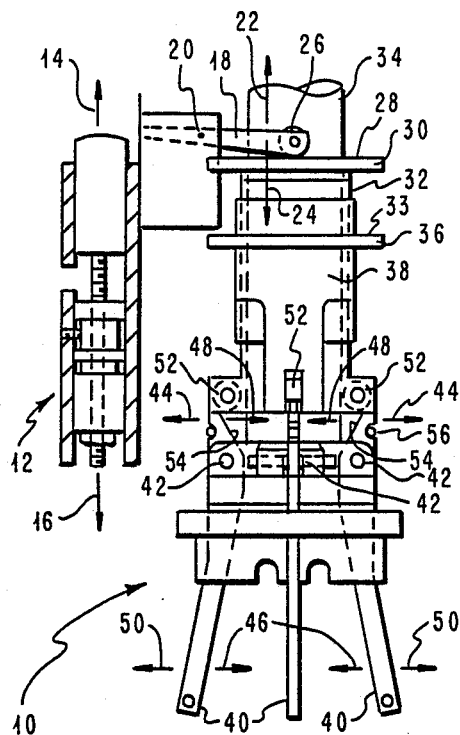
FIG. 1 is a side pictorial view of, partially in section, showing a portion of a component placement machine linked to a placement head assembly of the prior art.
Figure 2:
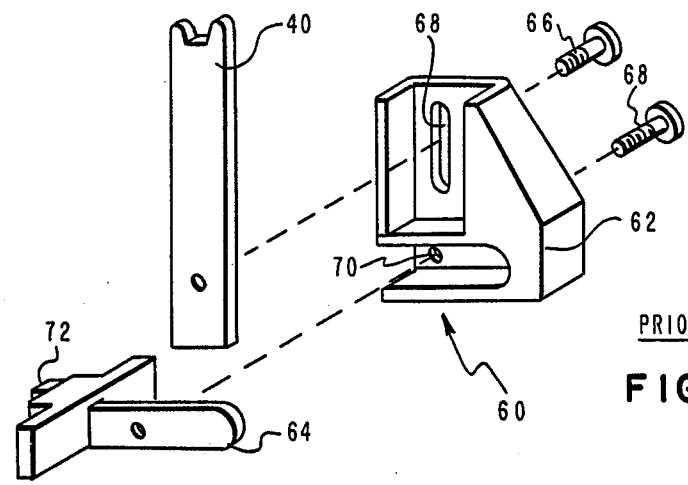
FIG. 2 is an exploded pictorial view of a tweezer head portion of the prior art head assembly depicted in FIG. 1.

First, it will be recalled that one of the serious deficiencies of prior head assembly designs was the large masses associated with the metal collars or sleeves 32 or 38 (FIG. 1). As these masses were brought into motion by means of the actuating levers 118, the inertia thereof was transmitted through the tweezers and the tweezer heads to the component. Consequently, if the assembly was not properly adjusted, this resulted in lead crushing or destruction of the component which, in essence, absorbs such inertial energy upon contact of the tweezer jaws with the component. Not only has such a deficiency been alleviated by the reduced mass carriage design of the present invention, but such inertial mass acting against the component has further been reduced by means of the apertures 226-230. Moreover, provision of such apertures has further provided a slight amount of pliancy or give to the tweezer heads in the radially outward direction upon contact with the component thereby further reducing the problems of component damage in the alignment operation performed by the tweezer heads.

Features of the present invention include reduced and more consistent friction in the actuator means by provision of a rolling action supported carriage design with more predictable travel on the shaft both off-line and when installed on a placement machine; reduced lateral play of the actuator means, again by reason of the rolling action design; and actuator means being carried completely and integrally as part of the head assembly itself (with the exception of the pressure-differential source) thereby avoiding prior design defects of mechanical linkages, interconnections, and adjustments with portions of the placement machine itself which provided the forces for moving the actuator means in previous designs.

Accordingly, due in part to the aforementioned features, it is contemplated by the present invention and a further feature thereof to pre-align and pre-adjust one or more of the subject head assemblies off-line, i.e., when separated from the placement machine for which it is intened. In this manner, down-time of the machine may be substantially reduced by avoiding the need for such alignment and adjustment of replacement head assemblies while actually on the machine when they are installed to replace a previously installed assembly.

More particularly, in one embodiment, the correlative radially inward and outward movement of the carriages in terms of relative magnitudes, timing, spatial positions, and the like, may be pre-aligned and pre-adjusted as required for aligning the chip 76 in a predetermined manner for a particular manufacturing operation by adjusting the corresponding mechanical components as necessary.

While the invention has been shown and described with reference to particular embodiments thereof, it will be understood by those skilled in the art that the foregoing and other changes in form and details may be made therein without departing from the spirit and scope of the invention.

I claim:

1. A placement head assembly for placing an electrical component on a circuit board, comprising:
   a main shaft defining an outer surface extending about a longitudinal axis;
   vacuum support means for releasable support of said component; and
   alignment means for aligning said component relative to said axis, said alignment means including carriage means carrying actuator means for urging said carriage means along said axis in response to fluid pressures and having upper and lower roller means engaging said outer surface.

2. Apparatus of claim 1 wherein said alignment means further includes
tweezer means radially inwardly movable into contact with said component in response to said urging of said alignment means along said axis.

3. The apparatus of claim 1 wherein said actuator means includes
means for urging said alignment means alternatively in opposing directions along said axis in response to variation in said fluid pressures.

4. The apparatus of claim 2 wherein said tweezer means includes
tweezer head means defining at least one cavity for reducing impact between said component and said tweezer means upon said contact of said tweezer means with said component.

5. The apparatus of claim 2 wherein said tweezer means includes
at least one pair of tweezer arms pendantly and pivotably disposed from said shaft in radially opposing relation; and wherein said alignment means includes
a pair of bearing surfaces each said bearing surface contacting a corresponding end of a respective one of said pair of tweezer arms.

6. The apparatus of claim 1 wherein said roller means includes
at least one roller in said roller engagement with said outer surface of said shaft defining an axis of rotation normal to said longitudinal axis.

7. The apparatus of claim 1 further including
at least one guide shaft assembly means for preventing rotational movement of said alignment means about said longitudinal axis.

8. The apparatus of claim 7 wherein said guide shaft assembly means comprises
a guide shaft extending along a guide shaft axis parallel to said longitudinal axis of said main shaft and spaced radially outwards of said outer surface of said main shaft; and
a guide shaft bearing surface defined by said alignment means in engagement with said guide shaft.

9. The apparatus of claim 8 wherein said guide shaft bearing surface is the outer surfaces of a pair of rollers having respective axes of rotation on either side of said guide shaft axis and normal thereto.

10. The apparatus of claim 3 wherein said variation in fluid pressures comprises two different pressure differentials alternatively within said urging means each corresponding to a different respective one of said opposing directions.

11. A method for aligning an electrical component for placement on a circuit board with a placement head assembly having a main shaft defining an outer surface extending about a longitudinal axis; a vacuum support; and an alignment means for rotational alignment of said component relative to said axis having tweezer means for contacting said component and carriage means having upper and lower portions and carrying actuator means for urging said carriage means along said axis in response to fluid pressure said method comprising:
supporting said component with said vacuum support;
disposing said carriage means about said outer surface and with said upper and lower portions thereof in rolling engagement with said outer surface;
generating a first pressure differential; and
communicating said first pressure differential to said actuator means to urge said carriage means along said axis in a first direction and moving said tweezer in response to the carriage means movement until said tweezer engages and aligns said component.

12. The method of claim 11 further including generating a second pressure differential; and communicating said second pressure differential to said actuator means to urge said carriage means along said axis in a second direction until said tweezer means disengages from said component.

13. A method for reducing electronic component placement machine down time during replacement of placement head assemblies therefor each said placement head assembly having a main shaft defining a longitudinal axis; vacuum support means for releasable support of said components; and alignment means for aligning said component relative to said axis, said method including the steps of:
disposing a first of said head assemblies at a location remotely of said placement machine;
introducing fluid pressure differential to said first head assembly;
pre-aligning said alignment means relative to said shaft in response to said introduced pressure differential;
removing a second of said head assemblies from said placement machine; and
installing said pre-aligned first head assembly in place of said second head assembly in said placement machine.

14. The method of claim 13 further including the step of pre-adjusting radially inward movement of a portion of said alignment means of said first head assembly in response to said introduced fluid pressure differential.

15. The method of claim 13 wherein said step of pre-aligning said alignment means comprises pre-adjusting movement of said alignment means along said axis.

16. A placement head assembly for positioning an electrical component for placement on a circuit board, comprising
a main shaft defining an outer surface extending about a longitudinal axis;
vacuum support means for releasably supporting said component;
two pairs of carriages, said carriages being disposed in quadrature about said shaft, each said pair comprised of
a passive carriage;
an active carriage diametrically opposing said passive carriage and having a wall defining a piston chamber therein; and
a support member interconnecting said passive and said active carriage extending transversely to said axis and on either side of said shaft, each said carriage having upper and lower rollers in contact with said shaft surface;
a pair of piston head support shafts interconnected to said main shaft and extending downwards into respective ones of said piston chambers;
each said support shaft having a piston head disposed on the end thereof in sealingly sliding engagement with said respective piston chamber; and
each said piston chamber including a port on either side of said piston head extending through said wall;

two pairs of tweezers, said tweezers being disposed in quadrature about said main shaft, each said tweezer being pivotably supported by said shaft and having an upper end in rolling engagement with a respective one of said carriages; and a lower end for contacting said component.

17. The apparatus of claim 16 further including a pair of guide shafts interconnected to said main shaft and extending downwards parallel to said axis; and a pair of rollers carried by each said passive carriage in rolling engagement with a respective one of said guide shafts.

18. A placement head assembly for use in an electrical component placement machine, comprising:

a main shaft defining a longitudinal axis and an outer surface;

a carriage assembly disposed about and movable along said shaft carrying a plurality of rollers engaging said outer surface of said shaft and further carrying pressure-responsive means for urging said carriage assembly in bidirectional mitions along said shaft; and tweezer means, including a tweezer jaw, for translating one of said carriage assembly motions into radially inward motion of said tweezer jaw.

19. A placement head assembly for use in an electrical component placement machine, comprising:

a main shaft defining a longitudinal axis and an outer surface;

a carriage assembly disposed about and movable along said shaft carrying a plurality of rollers engaging said outer surface of said shaft;

pressure-responsive means comprising a cylinder and a piston disposed within said cylinder for causing said movement of said carriage assembly along said shaft in response to fluid pressure differential within said carriage assembly; and tweezer means, including a tweezer jaw, for translating said carriage assembly movement into radially inward motion of said tweezer jaw.

20. The apparatus of claim 19 wherein when said piston is disposed within said cylinder, first and second chambers therein are defined; and wherein said cylinder includes first and second ports providing fluid communication from without said cylinder to said first and second chambers, respectively.

* * * * *